(12) United States Patent
Nguyen et al.

(10) Patent No.: US 9,398,715 B2
(45) Date of Patent: Jul. 19, 2016

(54) ELECTRONIC MODULE SHELF ASSEMBLY AND METHODS

(71) Applicant: General Electric Company, Schnectady, NY (US)

(72) Inventors: Khanh Quoc Nguyen, Lucas, TX (US); Christopher George Reed, McKinney, TX (US)

(73) Assignee: General Electric Company, Schenectady, NY (US)

( * ) Notice: Subject to any disclaimer, the term of this patent is extended or adjusted under 35 U.S.C. 154(b) by 313 days.

(21) Appl. No.: 13/842,074

(22) Filed: Mar. 15, 2013

(65) Prior Publication Data

US 2014/0211423 A1  Jul. 31, 2014

Related U.S. Application Data (60) Provisional application No. 61/757,196, filed on Jan. 27, 2013.

(51) Int. Cl.
*H05K 7/00* (2006.01)
*H05K 7/14* (2006.01)

(52) U.S. Cl.
CPC ......... *H05K 7/1409* (2013.01); *Y10T 29/49002* (2015.01)

(58) Field of Classification Search
USPC .................................. 361/801–803, 727, 728
See application file for complete search history.

(56) References Cited

U.S. PATENT DOCUMENTS

| | | | |
|---|---|---|---|
| 6,354,164 B1 * | 3/2002 | Megason et al. | 74/109 |
| 6,490,153 B1 * | 12/2002 | Casebolt et al. | 361/679.33 |
| 6,542,383 B1 | 4/2003 | Tsuyuki et al. | |
| 6,567,274 B1 | 5/2003 | Tusan et al. | |
| 6,603,657 B2 | 8/2003 | Tanzer et al. | |
| 6,754,074 B2 * | 6/2004 | McClelland et al. | 361/690 |
| 6,972,961 B2 | 12/2005 | Erskine | |
| 7,050,297 B2 * | 5/2006 | Chung | 361/679.35 |
| D544,866 S * | 6/2007 | Wang et al. | D14/438 |
| 7,304,855 B1 * | 12/2007 | Milligan et al. | 361/724 |
| 7,307,836 B2 * | 12/2007 | Scicluna et al. | 361/679.33 |
| 7,465,189 B2 * | 12/2008 | Marcade | G11B 33/128 439/567 |
| 7,483,268 B1 * | 1/2009 | King, Jr. | G06F 1/187 248/682 |
| 7,492,607 B2 | 2/2009 | Nguyen et al. | |
| 8,289,707 B2 * | 10/2012 | Liao | 361/679.58 |
| 8,385,076 B2 * | 2/2013 | Peng et al. | 361/740 |
| 2006/0056146 A1 * | 3/2006 | Marcade | G11B 33/12 361/679.32 |

\* cited by examiner

*Primary Examiner* — Hung S Bui
(74) *Attorney, Agent, or Firm* — General Electric Company (57) ABSTRACT

An electronics chassis comprises an electronics module residing in the chassis and fronted by a multi-piece faceplate system. The multi-piece faceplate system includes a faceplate and a faceplate assembly. The faceplate assembly includes an ejection lever pivotally coupled to the electronics module. The ejection lever includes an ejection latch coupled to the faceplate assembly. The ejection latch is configured to facilitate retention of the electronics module within the chassis when said faceplate assembly is in a closed position. The ejection latch is further configured to facilitate ejection of the electronics module from the chassis when the faceplate assembly is in an open position.

19 Claims, 11 Drawing Sheets

ELECTRONIC MODULE SHELF ASSEMBLY AND METHODS

CROSS REFERENCE TO RELATED APPLICATIONS

This application claims priority to and the benefit of the filing date of U.S. Provisional Application No. 61/757,196 filed on Jan. 27, 2013, which is hereby incorporated by reference in its entirety.

BACKGROUND

The embodiments described herein relate generally to an electronics module for a power distribution rack, and, more specifically, to a faceplate assembly for an electronics module and methods of assembly and use thereof.

Electrical components or modules are sometimes stored in a stacked relationship not only to allow the components or modules to be electrically interconnected with one another, but also so they can be readily accessed and used. This is particularly true in power management situations in which a large number of densely packed individual components are typically mounted together in a rack system to create a desired power management system. Such rack systems may consist of a frame structure including shelf assemblies that define individual slots into which smaller electronics modules, such as power modules, rectifiers, or controllers can be inserted. Due to high currents during operation and close proximity, the electronics may become fairly hot and would benefit from ventilation.

Further, the rack systems, including shelves and electronics modules, have been optimized to allow for the greatest number of modules in the smallest possible area. However, these modules are so densely packed that the clearance space between the modules residing on one shelf and the overlying shelf has been reduced such that it has become difficult to easily remove the modules from their respective slots, which is important for maintenance, repair or replacement. Due to the limited clearance between the module and the shelf, it is difficult for a technician to adequately grasp the module and exert enough force to disengage the corresponding electrical interfaces from each other. For example, it is often difficult to apply enough insertion and ejection force to adequately couple corresponding electrical interfaces.

BRIEF DESCRIPTION

In one aspect, an electronics chassis is provided. The chassis comprises an electronics module residing in the chassis and fronted by a multi-piece faceplate system. The multi-piece faceplate system includes a faceplate and a faceplate assembly. The faceplate assembly includes an ejection lever pivotally coupled to the electronics module. The ejection lever includes an ejection latch coupled to the faceplate assembly. The ejection latch is configured to facilitate retention of the electronics module within the chassis when said faceplate assembly is in a closed position. The ejection latch is further configured to facilitate ejection of the electronics module from the chassis when the faceplate assembly is in an open position.

In another aspect, a multi-piece faceplate system for use in an electronics module is provided. The multi-piece faceplate system resides within an electronics chassis and includes a faceplate and a faceplate assembly. The faceplate assembly includes an ejection lever pivotally coupled to the electronics module. The ejection lever includes an ejection latch coupled to the faceplate assembly. The ejection latch is configured to facilitate retention of the electronics module within the chassis when the faceplate assembly is in a closed position and is configured to facilitate ejection of the electronics module from the chassis when the faceplate assembly is in an open position.

In yet another aspect, a method of assembling an electronics chassis is provided. The method comprises providing an electronics module configured to reside in an electronics chassis and providing a multi-piece faceplate system including a faceplate and a faceplate assembly. The faceplate assembly includes an ejection lever and an ejection latch. The ejection lever is pivotally coupled to the electronics module. The ejection latch is removably coupled to the faceplate to facilitate retention of the electronics module within the electronics chassis when the faceplate assembly is in a closed position, and to facilitate ejection of the electronics module from the electronics chassis when the faceplate assembly is in an open position.

DETAILED DESCRIPTION

The embodiments include new faceplate systems that are placed in front of electronic modules such as power rectifiers. The faceplate systems have multiple pieces including one piece that permits, for example, ventilation in more than one direction due to a shape of the faceplate. Another piece of the faceplate systems has projective features to enable retention and to ease grabbing, opening and closing of the faceplate system. The faceplate system has simplified latching mechanisms to aid ejection of the electronic modules. After much simulation and experimentation, these and additional features were found to provide superior performance, reduced costs and easy use.

Figure 1:
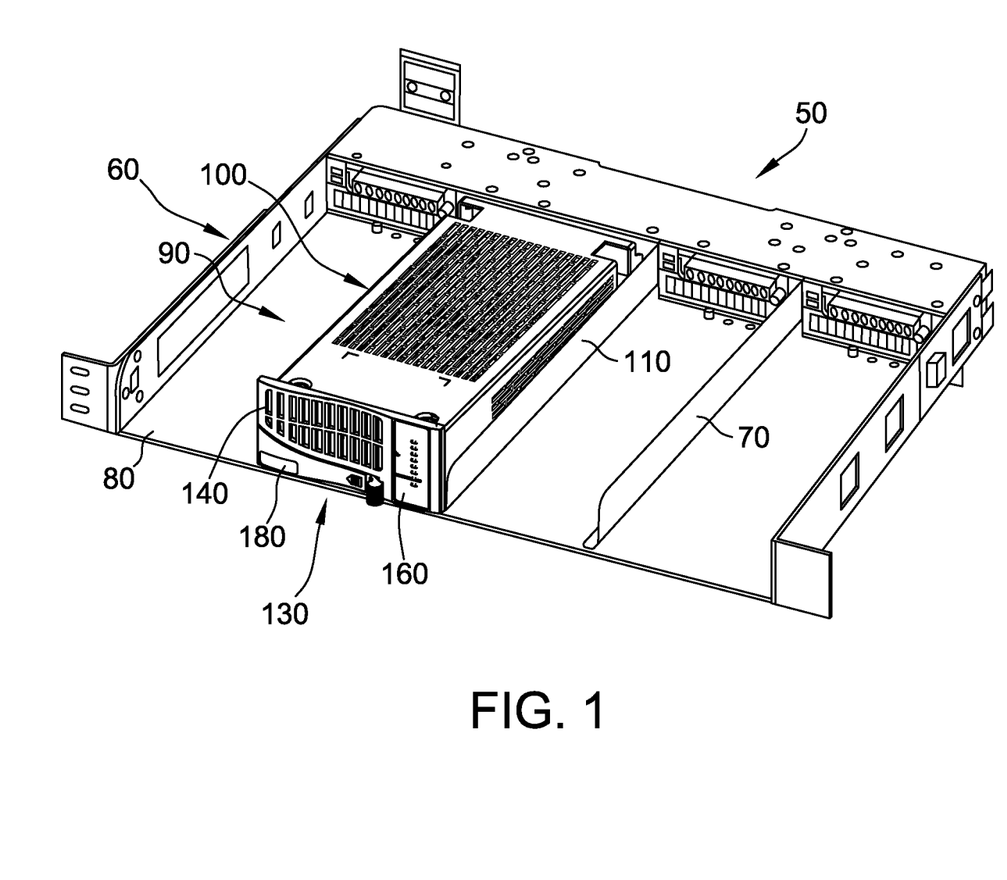
FIG. 1 is a perspective view of an exemplary embodiment of a shelf assembly illustrating an electronics module and a faceplate assembly mounted thereon.
Figure 2:
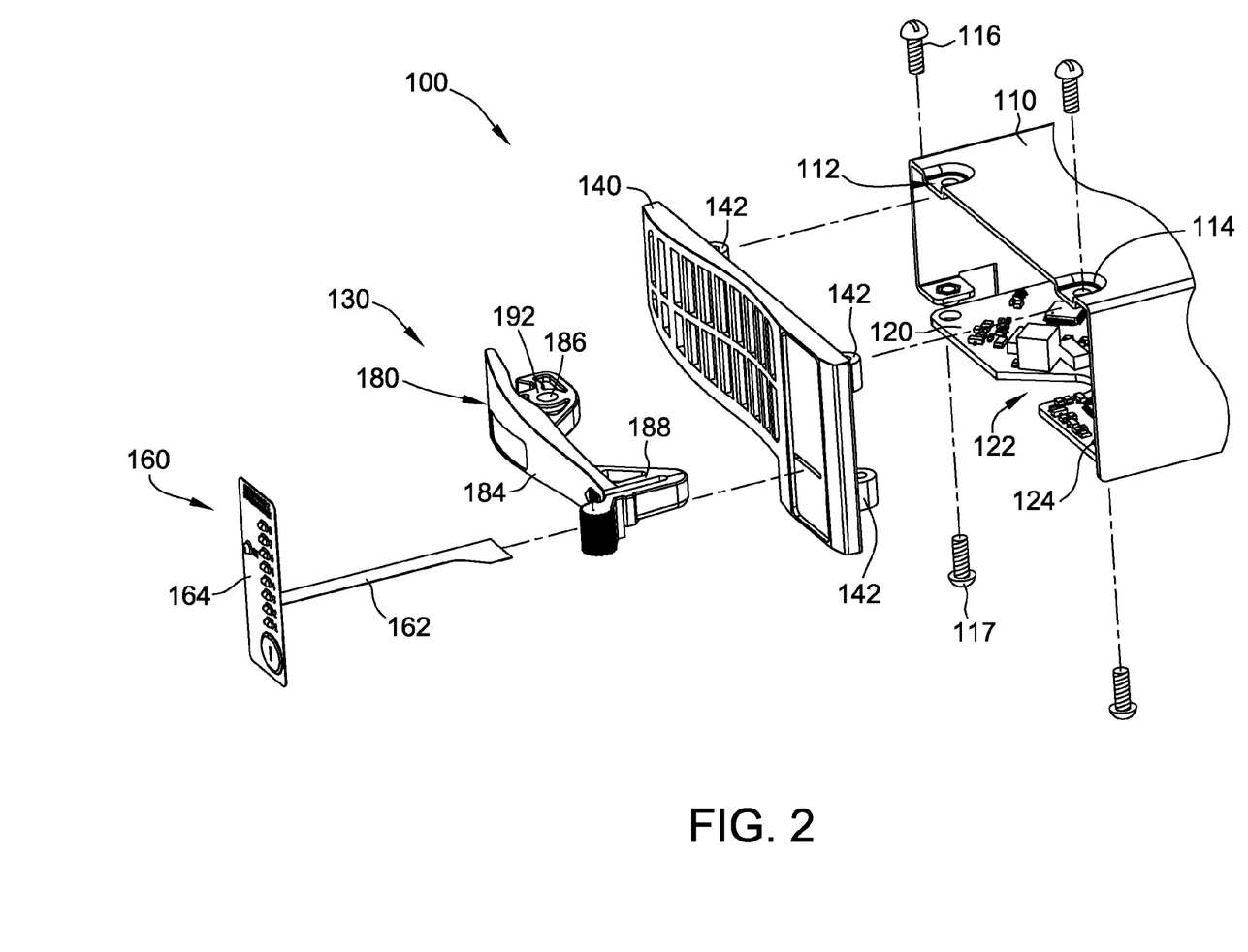
FIG. 2 is an exploded perspective view of a portion of the exemplary electronic module shown in FIG. 1.

FIG. 1 illustrates a perspective view of an electronics shelf assembly 50 including an electronics module 100. In different systems, shelf assembly 50 is a chassis or merely a backplane or rail into which the electronics module 100 can be inserted or mated. FIG. 2 is an exploded perspective view of a portion of the exemplary electronic module 100 shown in FIG. 1. Shelf assembly 50 can be of various types of construction and design. For example, in one application, shelf assembly 50 is configured as a power distribution module that can be inserted into a rack containing assemblies similar to shelf assembly 50. In the illustrated embodiment, shelf assembly 50 comprises a shelf 60 and at least one electronics module 100. Shelf 60 includes a base wall 80 that can be subdivided into a plurality of slots 90 by sidewalls 70. In the exemplary embodiment, shelf assembly 50 includes four slots 90. Alternatively, shelf assembly 50 may include as many slots 90 as necessary for shelf assembly 50 to function as described herein. In addition, instead of horizontal stacking, some systems have vertical stacking. Sidewalls 70 are appropriately spaced to accommodate the width of module 100 such that each module 100 is received by a respective slot 90. Similarly, shelf 60 has a depth that is sufficient to accommodate the length of module 100. Shelf 60 may be constructed from conventional materials, such as metal or hard plastics.

In the depicted exemplary embodiment of FIG. 2, module 100 includes a housing 110, a printed circuit board (PCB) 120, a faceplate assembly 130, and a faceplate 140. In common parlance, the faceplate 140 and faceplate assembly 130, together, may be generically called a "faceplate" because both pieces front the electronics module 100. But for purposes of this disclosure it is clearer to call the stationary piece 140, the faceplate 140. The non-stationary piece 130 that opens and closes like a door is termed the faceplate assembly 130. By the way of an overview, the faceplate 140 provides air venting, but in other embodiments, the faceplate assembly 130 can also provide additional air venting. The stationary faceplate 140 includes features such as warning lights and information. Alternatively, the faceplate 140 has more ventilation slots or multiple types of ventilation holes or slots angled in different orientation. Yet alternatively, the faceplate 140 has a non-planar surface (e.g. wave-like surface) such that the ventilation slots or holes are angled in different directions. The non-stationary faceplate assembly 130 enables a user to look into the electronics or to eject the electronics module 100 such as by opening the faceplate assembly 130, or pulling the faceplate assembly 130 so that is in an open position. To aid the opening and closing of the faceplate assembly 130, a user grabs a protruding feature (e.g. knob) or alternatively, presses a button-like object. The protruding feature or button-like object is coupled to a spring, a divot, wedge, or a clasp that helps to retain the faceplate assembly 130 in the closed position with respect to the electronics module 100 or aligned facially with respect to the stationary faceplate 140. These and additional details are now discussed in turn.

In FIG. 2, housing 110 is configured to cooperate with faceplate assembly 130 to protect the sensitive electronics of PCB 120. Faceplate assembly 130 includes a faceplate 140, a user interface assembly 160, and an ejection lever 180. Faceplate assembly 130 is located at the front end of shelf assembly 50 and module 100 extends to the back end of shelf assembly 50. In the exemplary embodiment, module 100 also includes an electrical interface (not shown) that mates with a corresponding electrical interface (not shown) located at the back end of each slot 90 of shelf 60. The corresponding connectors form a high friction fit that enables module 100 to perform its function. Because of the tight friction fit between the connectors that couple module 100 to shelf assembly 50, a substantial force is required to disengage module 100 from shelf assembly 50.

As shown in FIG. 2, housing 110 includes a plurality of recessed portions 112 that each includes an opening 114. Similarly, PCB 120 includes a plurality of mounting apertures 124. Furthermore, faceplate 140 includes a plurality of integral mounting bosses 142 that are configured to align with openings 114 of housing 110 and with apertures 124 of PCB 120. In the exemplary embodiment, shelf assembly 50 includes a plurality of fasteners 116 that are configured to be inserted into openings 114, bosses 142, and apertures 124 to facilitate coupling faceplate 140, PCB 120, and housing 110. Additionally, ejection lever 180 includes an opening 186 that is aligned with one of openings 114 and one of apertures 124. In the exemplary embodiment, a pivot fastener 117 is configured to be inserted through one of openings 114, one of apertures 124, and opening 186 to pivotally couple ejection lever 180 to faceplate 140, housing 110, and PCB 120. Pivot fastener 117 is configured to facilitate operation of ejection lever between an open position and a closed position.

In one embodiment, the ejection of the electronics module 100 is accomplished by the features all co-located on one piece of the faceplate assembly 130. In the depicted exemplary embodiment, ejection lever 180 includes an integrated spring latch 188, an insertion/ejection tool 192, and a lever body 184 extending there between. Integrated spring latch 188 is configured to facilitate operation of ejection lever 180 and to retain module 100 within shelf assembly 50 as described in further detail below. Insertion/ejection tool 192 is configured to cooperate with at least a portion of sidewall 70 to facilitate insertion and removal of module 100 from shelf assembly 50 as described in further detail below. In the exemplary embodiment, user interface assembly 160 includes a user interface 164 and an integrated flex circuit 162. User interface assembly 160 is configured to display the overall status of module 100 and to interact with a user (not shown) to indicate the status of a plurality of components coupled to module 100. Flex circuit 162 is configured to relay a signal generated by the user-user interface interaction to PCB 120.

Figure 3:
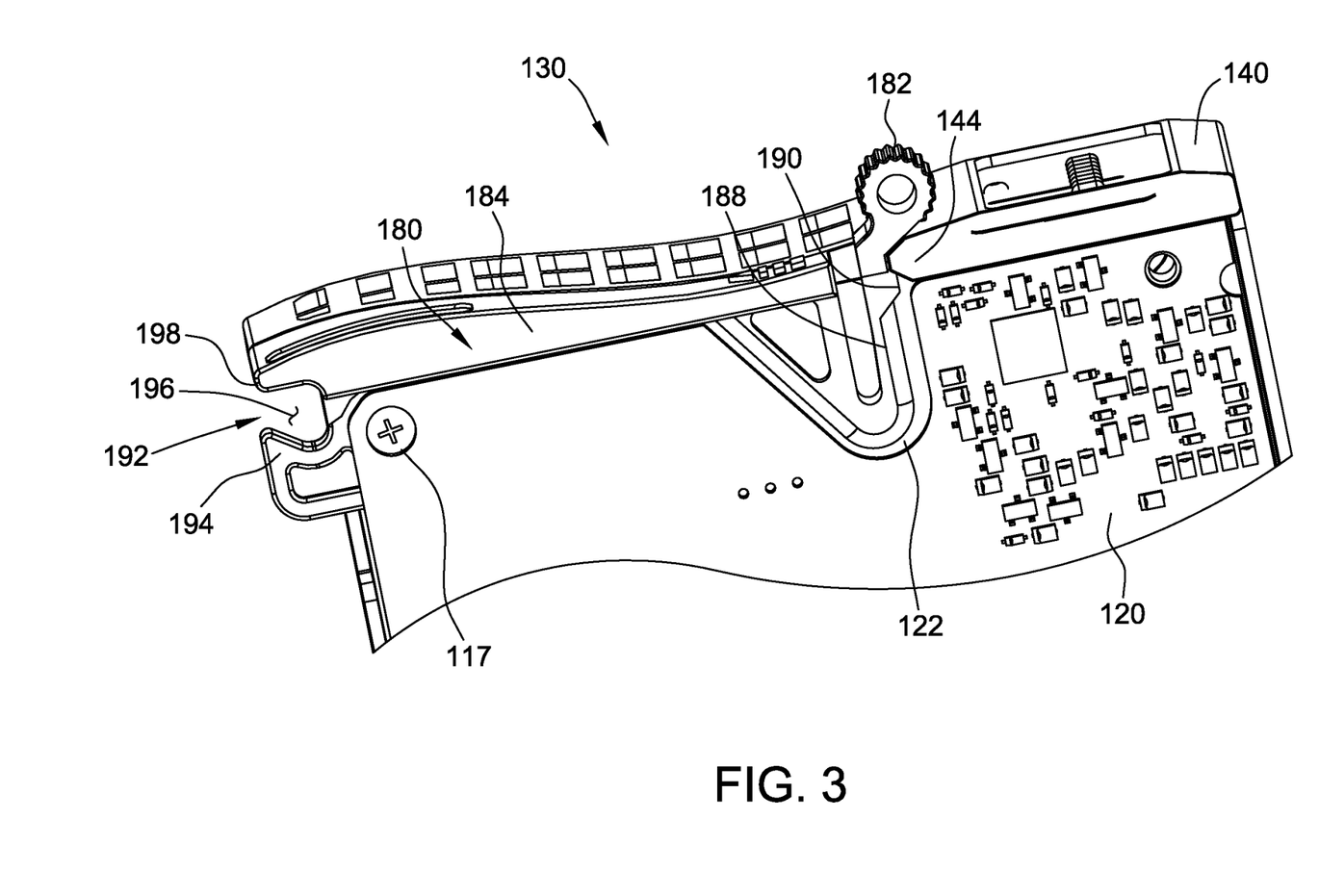
FIG. 3 is a partial perspective bottom view of the exemplary electronics module illustrating the faceplate assembly with the ejection lever in a closed position.
Figure 4:
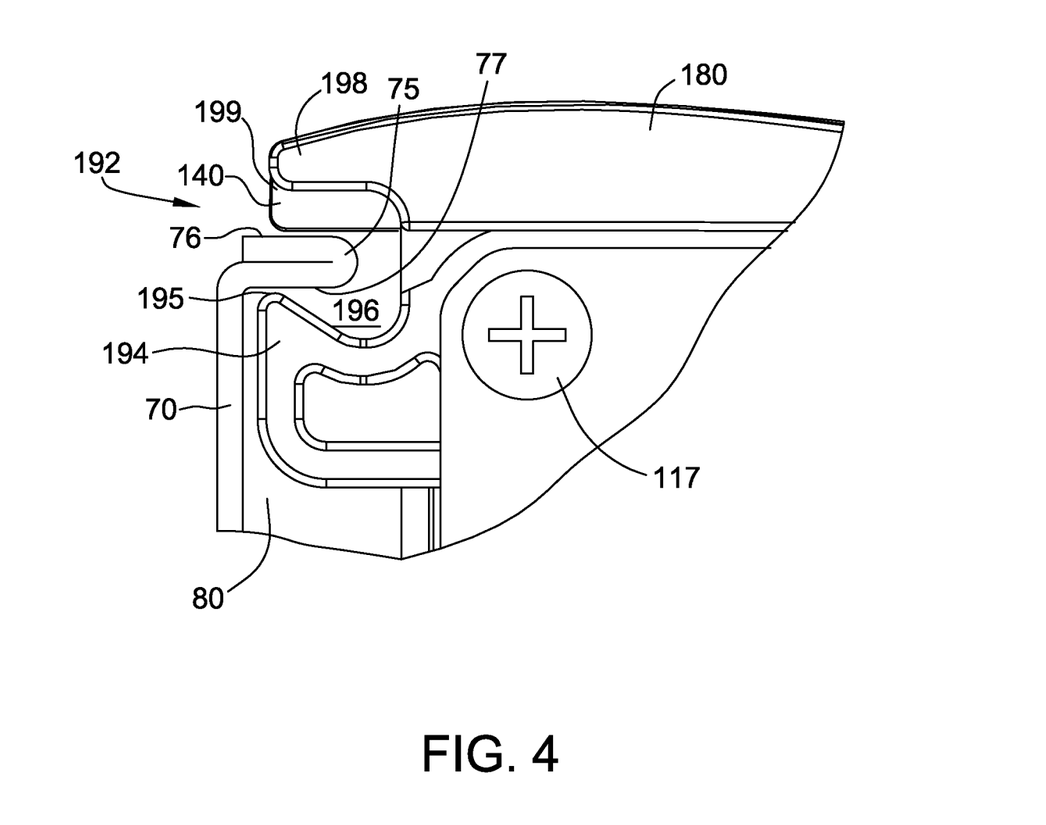
FIG. 4 is an enlarged view of a portion of the bottom of the exemplary electronics module illustrating the faceplate assembly with the ejection lever in a closed position.
Figure 5:
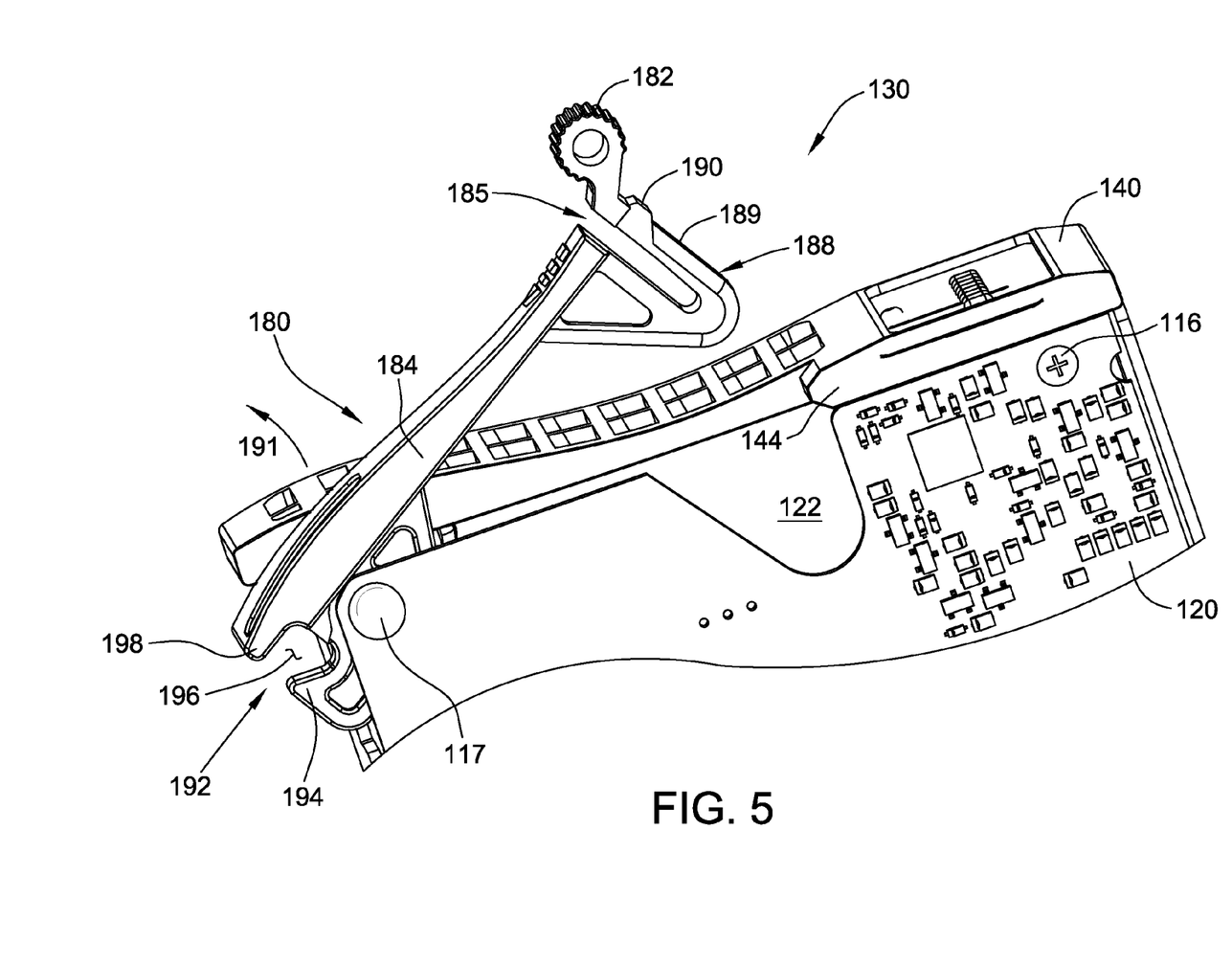
FIG. 5 is a partial perspective bottom view of the exemplary electronics module with the ejection lever in a partially open position.
Figure 6:
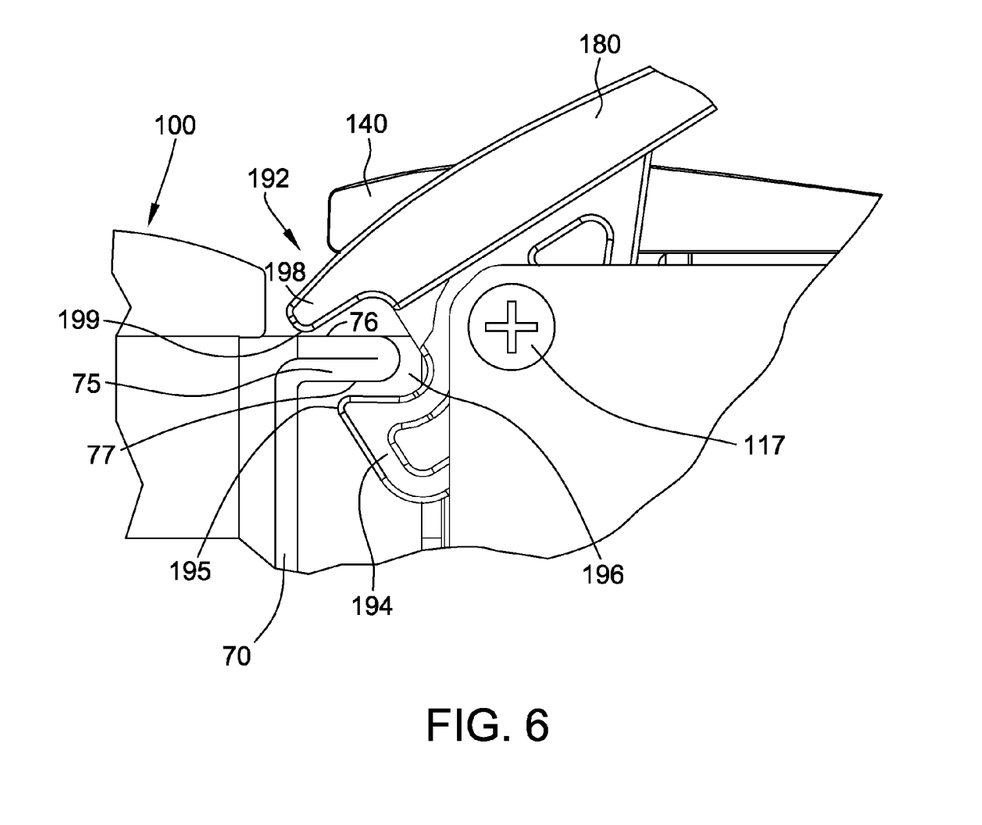
FIG. 6 is an enlarged view of a portion of the bottom of the exemplary electronics module with the ejection lever in a partially open position.

FIG. 3 is a partial perspective bottom view of module 100 (shown in FIGS. 1 and 2) illustrating faceplate assembly 130 with ejection lever 180 in a closed position. FIG. 4 is an enlarged view of a portion of the bottom of module 100 illustrating faceplate assembly 130 with ejection lever 180 in a closed position. FIG. 5 is a partial perspective bottom view of module 100 illustrating faceplate assembly 130 with ejection lever 180 in an open position. FIG. 6 is an enlarged view of a portion of the bottom of shelf assembly 50 (shown in FIG. 1) and module 100 illustrating the faceplate assembly 130 with ejection lever 180 in an open position. In FIGS. 4 and 6, base wall 80 of shelf 60 (shown in FIG. 1) is removed for clarification purposes. In the exemplary embodiment, sidewall 70 of shelf 60 includes a fulcrum section 75 located adjacent a front end of shelf 60. Fulcrum section 75 is perpendicular to sidewall 70 and includes a front face 76 and a back face 77. As explained below in more detail, fulcrum section 75 cooperates with insertion/ejection tool 192 of ejection lever 180 to provide a latching force and an ejection force of module 100 with respect to shelf assembly 50.

In one exemplary embodiment, insertion/ejection tool 192 of ejection lever 180 includes an insertion portion 194 that comprises a first contact surface 195 and an ejection portion 198 that comprises a second contact surface 199. In the exemplary embodiment, insertion portion 194 and ejection portion 198 are spaced apart to define a cavity 196 there between. As described in further detail below, cavity 196 is configured to accept fulcrum section 75 to facilitate insertion and ejection of module 100 from shelf 60. Insertion portion 194 has an arcuate shape, and specifically, insertion portion 194 has a continuously smooth hook shape to engage at least a portion of shelf 60 to facilitate operation of ejection lever 180. In the exemplary embodiment, insertion/ejection tool 192 is integrally formed with ejection lever 180. Alternatively, insertion/ejection tool 192 may be formed separately and coupled to ejection lever 180. Ejection lever body 184 is spaced between insertion/ejection tool 192 and integrated spring latch 188. In the exemplary embodiment, integrated spring latch 188 includes a spring arm 189 and an activation knob 182 coupled at a distal end of spring arm 189. Spring arm 189 includes a wedge or a projection 190 that is configured to cooperate with a projection land 144 on faceplate 140 to facilitate locking ejection lever 180 to faceplate 140 and retaining module 100 within shelf assembly 50.

FIG. 3 shows the cooperative engagement between ejection lever 180 and faceplate 140. Specifically, FIG. 3 illustrates ejection lever 180 in a closed position where projection 190 is latchably engaged with land 144 such that module 100 is retained within shelf assembly 50. In operation, ejection lever 180 is configured to pivot about fastener 117 such that spring latch 188 is inserted into a cavity 122 defined in PCB 120. As ejection lever 180 moves into a closed position, projection 190 contacts land 144 such that spring arm 189 is biased a minimal distance toward insertion/ejection tool 192 to allow projection 190 to move past land 144. When projection 190 has moved beyond land 144, spring arm 189 returns to its initial, natural position. In the closed position, ejection lever 180 is latchably engaged with faceplate 140 such that projection 190 is removably coupled with land 144 and land 144 is configured to be positioned between projection 190 and knob 182 to facilitate retention of module 100. In one embodiment, spring latch 188 is integrally formed with ejection lever 180 such that spring latch 188 includes no additional components, such as a spring, other than those described.

In one exemplary embodiment, integrated spring latch 188 and insertion/ejection tool 192 work simultaneously to facilitate insertion and ejection of module 100 (shown in FIGS. 1 and 2). As ejection lever 180 pivots about fastener 117 and integrated spring latch 188 engages faceplate land 144, insertion/ejection tool 192 engages fulcrum section 75 to move module 100 into position on shelf 60 (shown in FIG. 1). As shown in FIG. 4, insertion portion 194 of insertion/ejection tool 192 engages fulcrum section 75 of shelf 60 to position module 100. Specifically, first contact surface 195 is configured to engage back face 77 of fulcrum section 75 when module 100 is positioned on shelf 60 and ejection lever 180 is in a closed position and to exert an insertion force sufficient to cause the corresponding electrical interfaces of module 100 and shelf 60 to sufficiently engage and retain module 100 in position.

FIG. 5 shows ejection lever 180 in a partially open position where projection 190 is disengaged from land 144 such that ejection lever 180 pivots about fastener 117 to facilitate removal of module 100 from shelf 60 (shown in FIG. 1). In operation, a user activates knob 182 to bias spring arm 189 so that it moves a distance toward insertion/ejection tool 192. This movement disengages projection 190 from land 144 such that ejection lever 180 pivots about fastener 117 in the direction indicated by arrow 191. As shown in FIG. 6, the pivoting of ejection lever 180 about fastener 117 causes insertion portion 194 of insertion/ejection tool 192 to disengage fulcrum section 75 to facilitate forward movement of module 100. Simultaneously, ejection portion 198 of insertion/ejection tool 192 begins to engage fulcrum section 75. Specifically, second contact surface 199 of ejection portion 198 is configured to engage front face 76 of fulcrum section 75 such that further rotation of ejection lever 180 about fastener 117 exerts an ejection force on fulcrum section 75 to fully disengage the corresponding electrical interfaces of module 100 (shown in FIGS. 1 and 2) and shelf 60 and facilitate ejection of module 100 from shelf 60. During operation, faceplate 140 is coupled to housing 110 (shown in FIGS. 1 and 2) and remains stationary such that the forces required to insert and/or eject module 100 are applied through the rotation of ejection lever 180.

Figure 7:
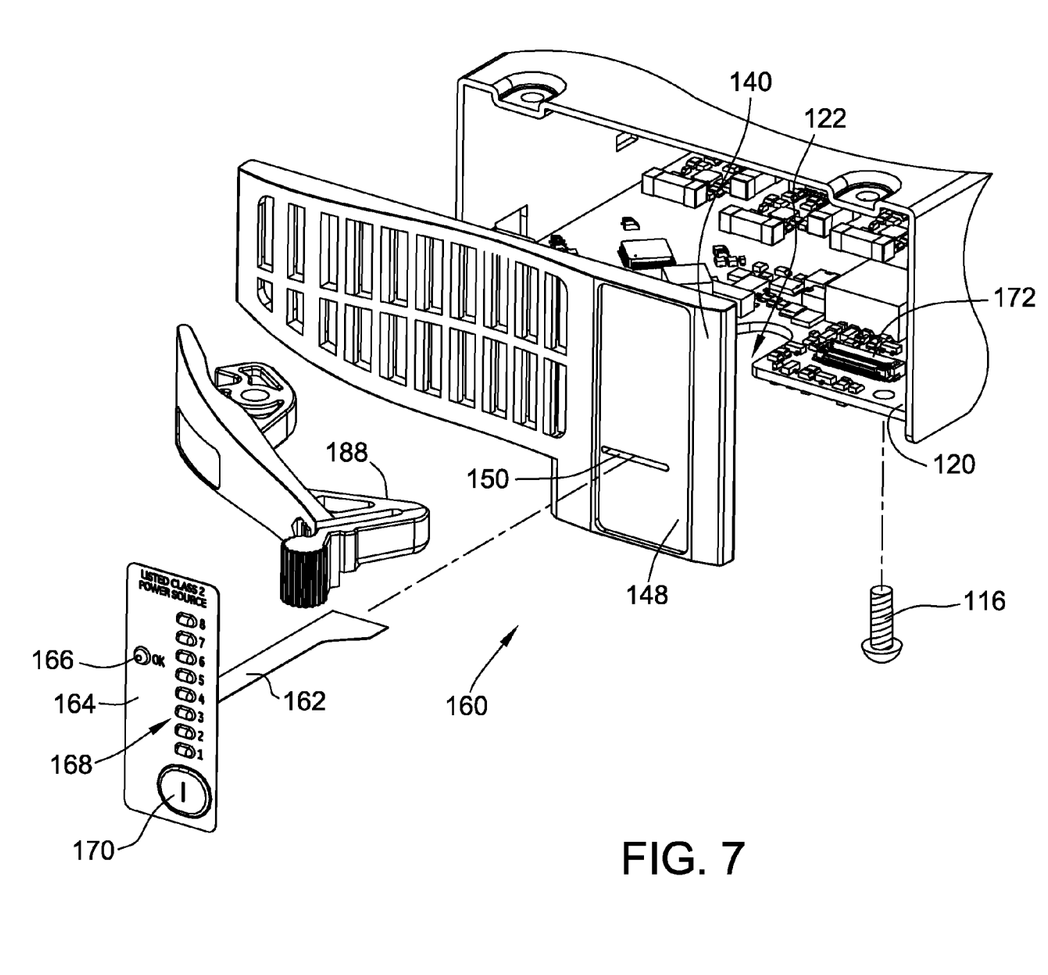
FIG. 7 is an exploded perspective view of an exemplary user interface assembly of the faceplate assembly shown in FIGS. 1 and 2.

FIG. 7 illustrates an exploded perspective view of user interface assembly 160 of faceplate assembly 130 shown in FIGS. 1 and 2. As described above, user interface assembly 160 includes user interface 164 and integrated flex circuit 162. User interface 164 includes a module status indicator 166, a plurality of component indicators 168, and a membrane switch 170. In the exemplary embodiment, user interface assembly 160 is configured to display the overall status of module 100 (shown in FIGS. 1 and 2) on module status indicator 166 and to interact with a user (not shown) through switch 170 to indicate the status of a plurality of electronic components (not shown) coupled to module 100. Switch 170 is an interactive device that facilitates interaction between module 100 and the user. Each module 100 is configured to govern the amount of power distributed to each electronic component coupled thereto. In the exemplary embodiment, up to eight components are coupled to module 100, although any number of components may be coupled to module 100 that enable module 100 to operate as described herein. The plurality of component indicators 168 includes one indicator for each of the number of electronic components able to be coupled to module 100.

In one exemplary embodiment, module status indicator 166 and each of the plurality of component indicators 168 include a multi-colored integrated light emitting diode (LED) configured to indicate the status of module 100 or the status of any of the electronic components coupled to module 100, respectively. In the exemplary embodiment, integrated flex circuit 162 of user interface assembly 160 is threaded through a single wide-tolerance slot 150 defined in faceplate 140 and user interface 164 is coupled to a user interface accepting surface 148 of faceplate 140 using a pressure sensitive adhesive. Alternatively, user interface 164 may be coupled to surface 148 of faceplate 140 using any coupling means that enables user interface assembly 160 to operate as described herein. The LEDs of module status indicator 166 and each of the plurality of component indicators 168 are integrated into flex circuit 162 and user interface 164 such that faceplate 140 requires no additional openings defined therein, other than slot 150. Flex circuit 162 is coupled to a connector 172 on PCB 120 and is configured to transmit signals between user interface 164 and PCB 120 as described in further detail below.

In an exemplary method of use or operation, after a component is coupled to module 100, switch 170 receives input from a user, in the form of the user pressing switch 170, to command module 100 to determine the status of any components coupled to module 100 and report back the status of each electronic component and of module 100 overall. Integrated flex circuit 162 is configured to relay a signal generated by the user pressing switch 170 to PCB 120 for analysis. Module 100, specifically PCB 120, includes logic that receives the signal from flex circuit 162 and determines the number of electronic components coupled to module 100 and their individual statuses, that is, whether they are operating normally. For each component coupled to module 100 that is operating normally, PCB 120 sends a response signal through flex circuit 162 to the LED that corresponds with that component, and the LED will turn a first color, e.g., green. For each component coupled to module 100 that is not operating normally, the LED shows a second color, e.g., red. If there are not as many components coupled to module 100 as there are indicators 168, the LEDs for those indicators 168 remain unlit. As such, membrane switch 170 facilitates interaction between the user and module 100 that indicates not only the status of module 100, but also of each electronic component coupled to module 100. Module status indicator 166 provides an instant indication through its LED of the status of module 100 on a system level, and the plurality of component indicators 168 provide indications through LEDs of the status of each electronic component coupled to module 100 individually.

In one method of use and assembly, the faceplate 140 is screwed or bolted onto the interior of the upper and/or lower (e.g. PCB 120) surface of the electronics module 100. The faceplate assembly 130 is bolted onto the interior side of the bottom surface of the electronics module 100 or onto the PCB 120. In this sense, the faceplate 140 and faceplate assembly 130 are both directly attached to the electronics module 100 or to its chassis. The spring arm 189 locks into a body of the stationary faceplate 140 via the integrated spring latch 188 including projection 190 and the flexibility to move due to the gap 185 space between 182 and 184 (see FIG. 5). The knob 182 is knurled to facilitate grabbing or gripping or actuating, but the knob 182 is alternatively smooth and in some shape that is easy to manually clasp. The faceplate 140 and faceplate assembly 130 are both made of metal or plastic. Alternatively, faceplate 140 is made of one material and the faceplate assembly 130 made of another material. In one embodiment, faceplate assembly 130 is made of a more durable material than that of the faceplate 140 because the assembly piece 130 encounters more motion, has to be retained, etc. As yet another alternative, the knob 182 has a lower profile (e.g. flush with that of the tallest region (crest) of the faceplate 140 wave) so as to avoid being broken off due to being brushed against. When the faceplate assembly 130 is the closed position, it lies flush with the faceplate 140. In one embodiment, the faceplate assembly 130 has the same curvature as that of the faceplate 140 wave.

If the chassis (outer shell) and electronics module 100 contain sensitive electronics or power electronics that are used in datacenters and/or telecommunication centers where a power outage would be especially problematic, the faceplate 140 or faceplate assembly 130 is coated with a fluorescent-like material or paint so that they would be highly visible.

Figure 8:
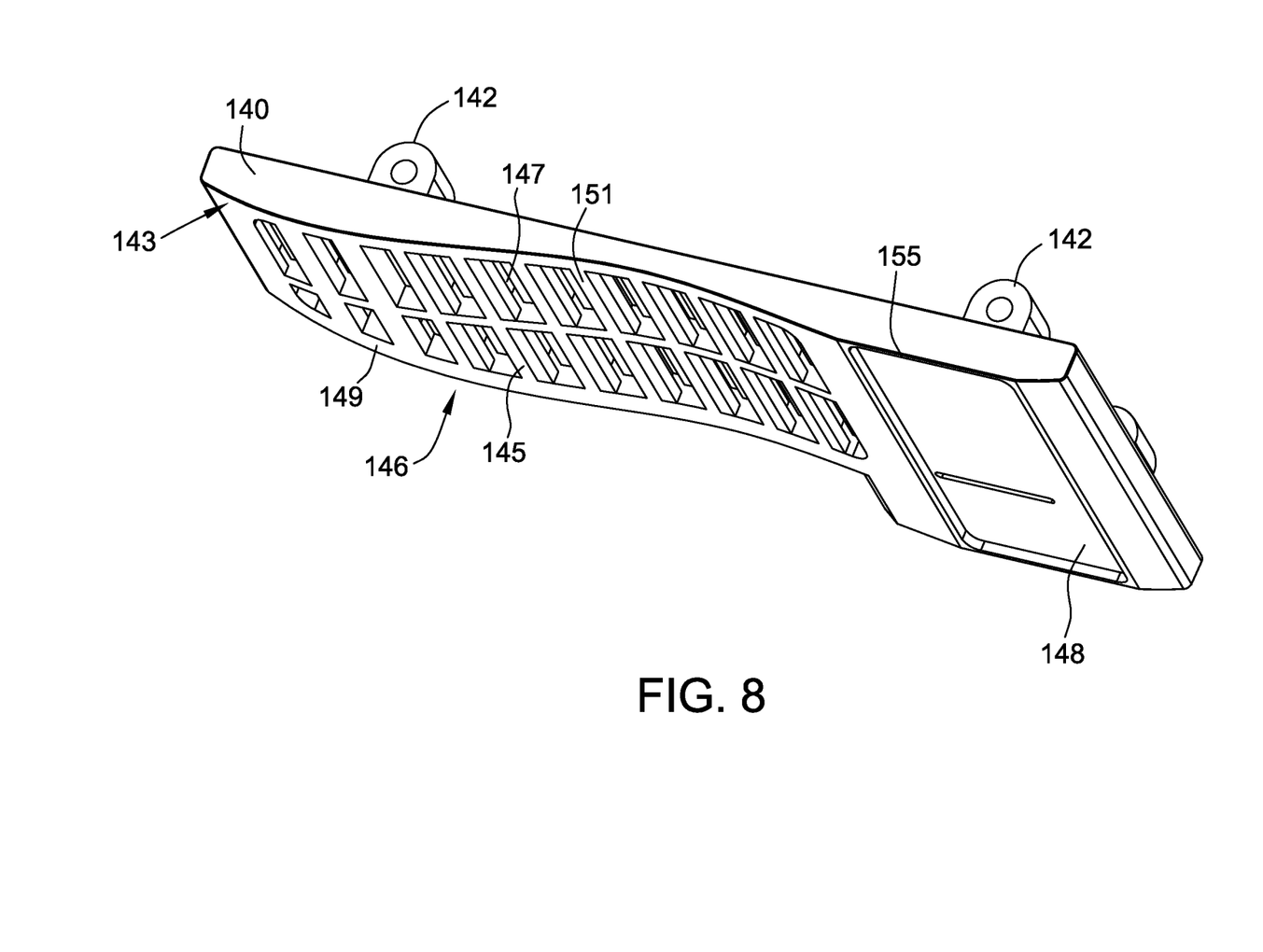
FIG. 8 is a perspective view of an exemplary faceplate of the faceplate assembly shown in FIGS. 1 and 2.

FIG. 8 is a perspective view of faceplate 140. As described above, faceplate 140 is coupled to housing 110 (shown in FIGS. 1 and 2) via integrated mounting bosses 142 and includes user interface accepting surface 148. Faceplate 140 is constructed of a durable material, such as a hard plastic or metal, and is configured to protect the internal components of module 100 (shown in FIGS. 1 and 2), such as PCB 120. In the exemplary embodiment, faceplate includes a plurality of vents 146 to provide air flow therethrough to facilitate cooling of module 100. Plurality of vents 146 includes a plurality of front slats 145 and a plurality of back slats 147. In the exemplary embodiment, front and back slats 145 and 147 are staggered, or offset, in both the X and Y directions such that, when viewed directly from the front, faceplate 140 appears to be a solid faceplate. That is, offsetting front and back slats 145 and 147 facilitates protecting the internal components of module 100, such as PCB 120, from foreign objects being inserted or entering into module 100. The amount of offset in the Y direction determines both the thickness of faceplate 140 and the amount of cooling provided to module 100. In embodiments where module 100 is convectively cooled, the offset in the Y direction is greater to allow for more cooling. In embodiments where module 100 is forced air cooled, the Y direction offset may be smaller. Generally, plurality of vents 146 is configured to allow for a maximum amount of air flow to facilitate cooling module 100.

In one exemplary embodiment, faceplate 140 includes a wave-like, undulated front face 143 that includes a first peak 149 at one end, a trough 151 in the middle portion, and a second peak 155 at the second opposing end. Similarly, ejection lever 180 (shown in FIGS. 2-6) has a corresponding undulated shape. In the exemplary embodiment, one of peaks 149 or 155 corresponds with user interface accepting surface 148 and is therefore flattened to facilitate coupling of user interface 164. Alternatively, because user interface 164 is formed from a flexible material, the peak 149 or 155 corresponding with user interface accepting surface 148 may not be flattened. Undulated front face 143 of faceplate 140 provides more surface area along faceplate 140, which allows for a greater number of vents 146. Furthermore, the wave-like shape of front face 143 facilitates directing cooling air into module 100 independent of the direction of air flow in which module 100 is housed. In the exemplary embodiment, undulated front face 143 in combination with the staggering of front and back slats 145 and 147 facilitates allowing at least some air to flow into module 100 independent of the angle at which the air is flowing.

Figure 9:
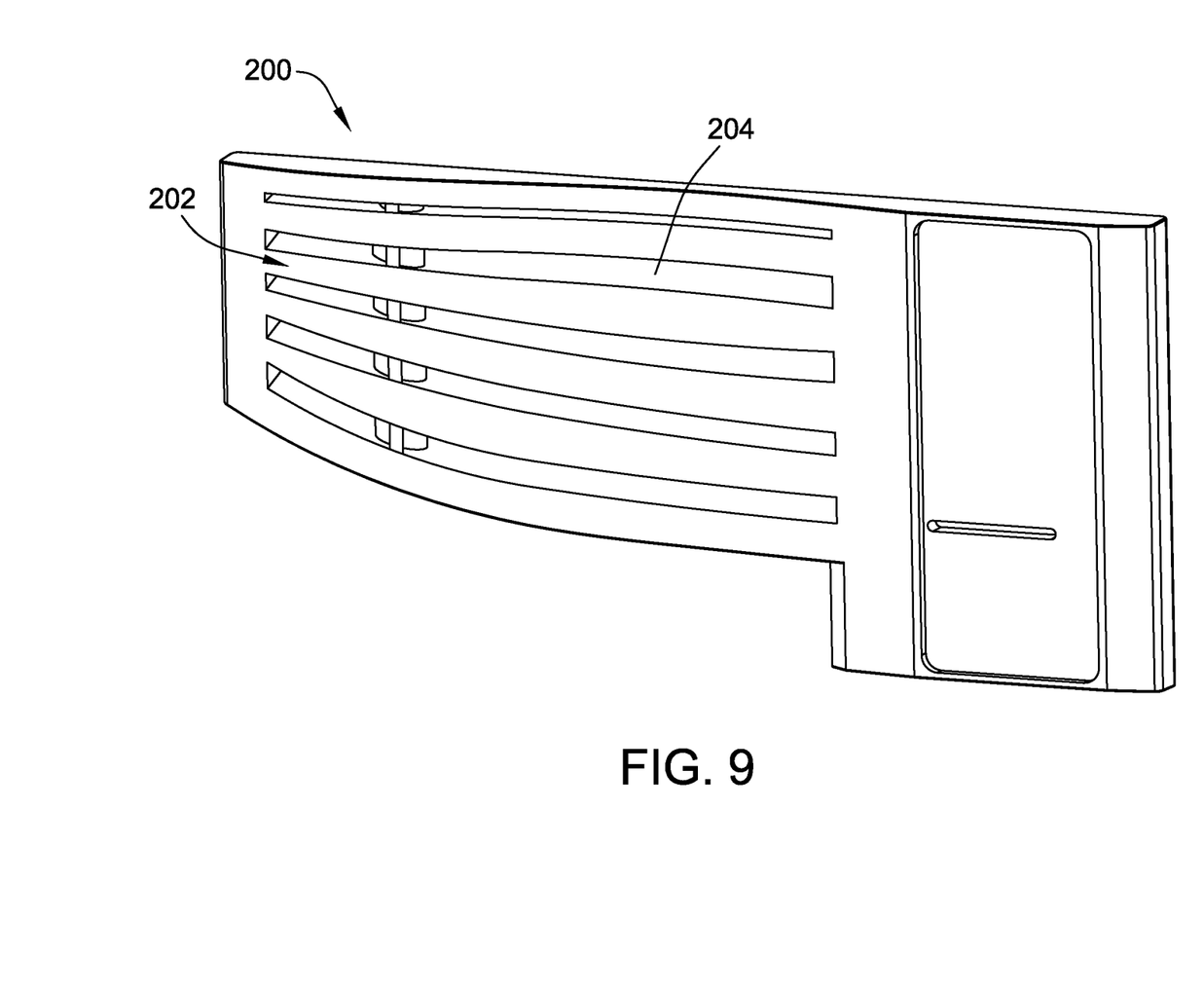
FIG. 9 is an alternative embodiment of the faceplate of the faceplate assembly shown in FIGS. 1 and 2.

FIG. 9 illustrates an alternative embodiment of a faceplate 200 for use in faceplate assembly 130 of shelf assembly 50 (both shown in FIG. 1). Faceplate 200 is substantially similar to faceplate 140 (shown in FIG. 8) in operation and composition, with the exception that faceplate 200 includes a louvered venting design 202 rather than venting 146 that includes front and back slats 145 and 147 (shown in FIG. 8). Although not shown in FIG. 9, faceplate 200 includes integrated mounting bosses and an undulated shape similar to bosses 142 and front face 143 of faceplate 140. In the exemplary embodiment, louvered venting 202 includes a plurality of slats 204 that are configured to facilitate channeling a maximum amount of cooling air through slats 204 into module 100.

Figure 10:
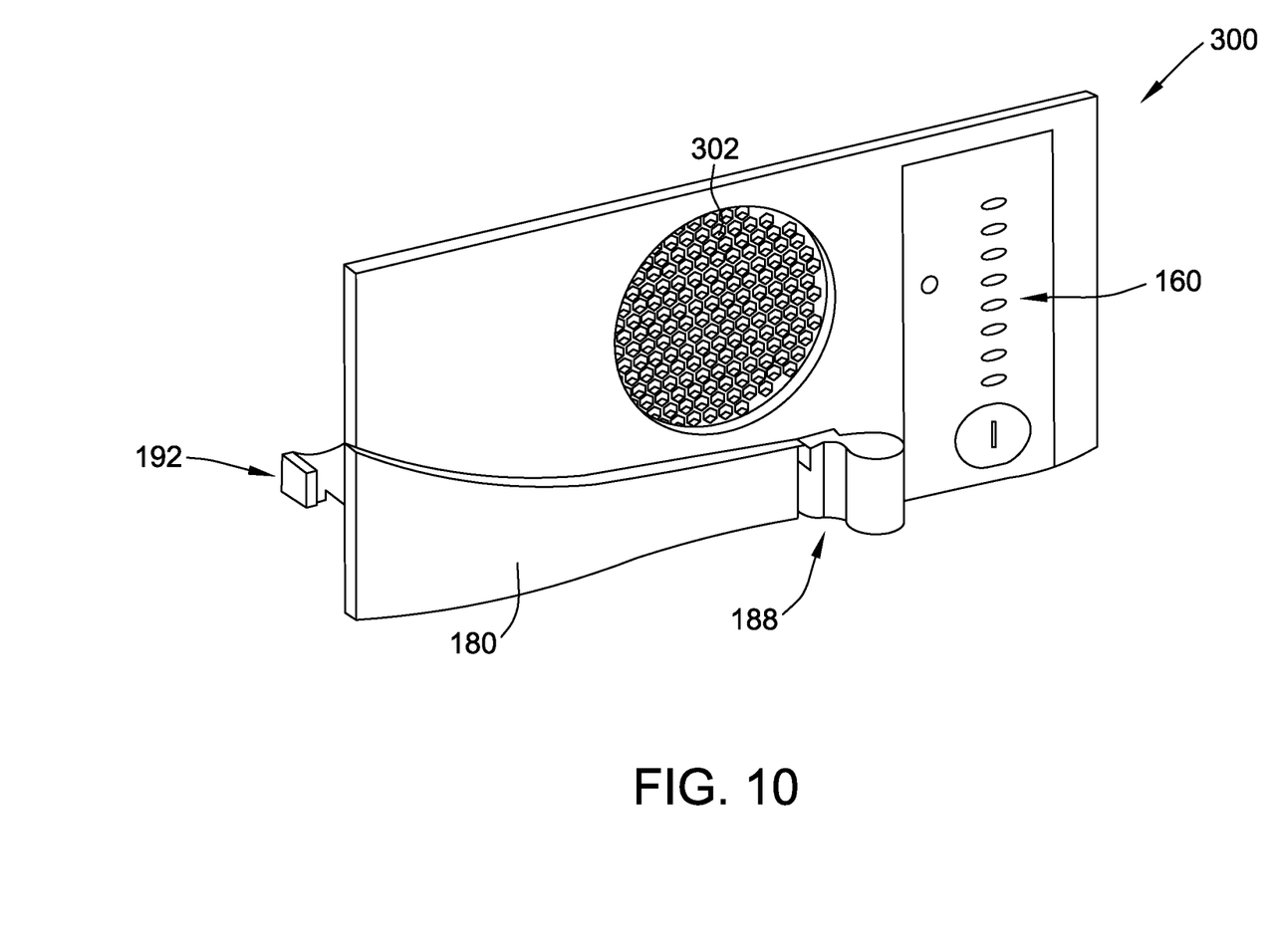
FIG. 10 is an additional alternative embodiment of the faceplate of the faceplate assembly shown in FIGS. 1 and 2.

FIG. 10 illustrates an alternative embodiment of a faceplate assembly 300 for use in shelf assembly 50 (shown in FIG. 1). Faceplate assembly 300 is substantially similar to faceplate assembly 130 (shown in FIGS. 1 and 2) in operation and composition, with the exception that faceplate assembly 300 includes a hex grille venting design 302 rather than venting 146 that includes front and back slats 145 and 147 (shown in FIG. 8). As such, components shown in FIG. 10 are labeled with the same reference numbers used in FIGS. 1 and 2. In the exemplary embodiment, hex grille 302 is shaped to correspond with the shape of a fan mounted within module 100 (shown in FIGS. 1 and 2). In some embodiments, where convective cooling does not provide sufficient cooling air, module 100 requires a small diameter fan to provide forced air cooling of PCB 120. The fan draws air through hex grille 302 and distributes it within the interior of module 100 to cool the internal components of module 100, such as PCB 120. Alternatively, module 100 has a plurality of vents 146 (shown in FIG. 8) and may also include a fan mounted within module 100 that draws air through vents 146 to cool PCB 120.

Figure 11:
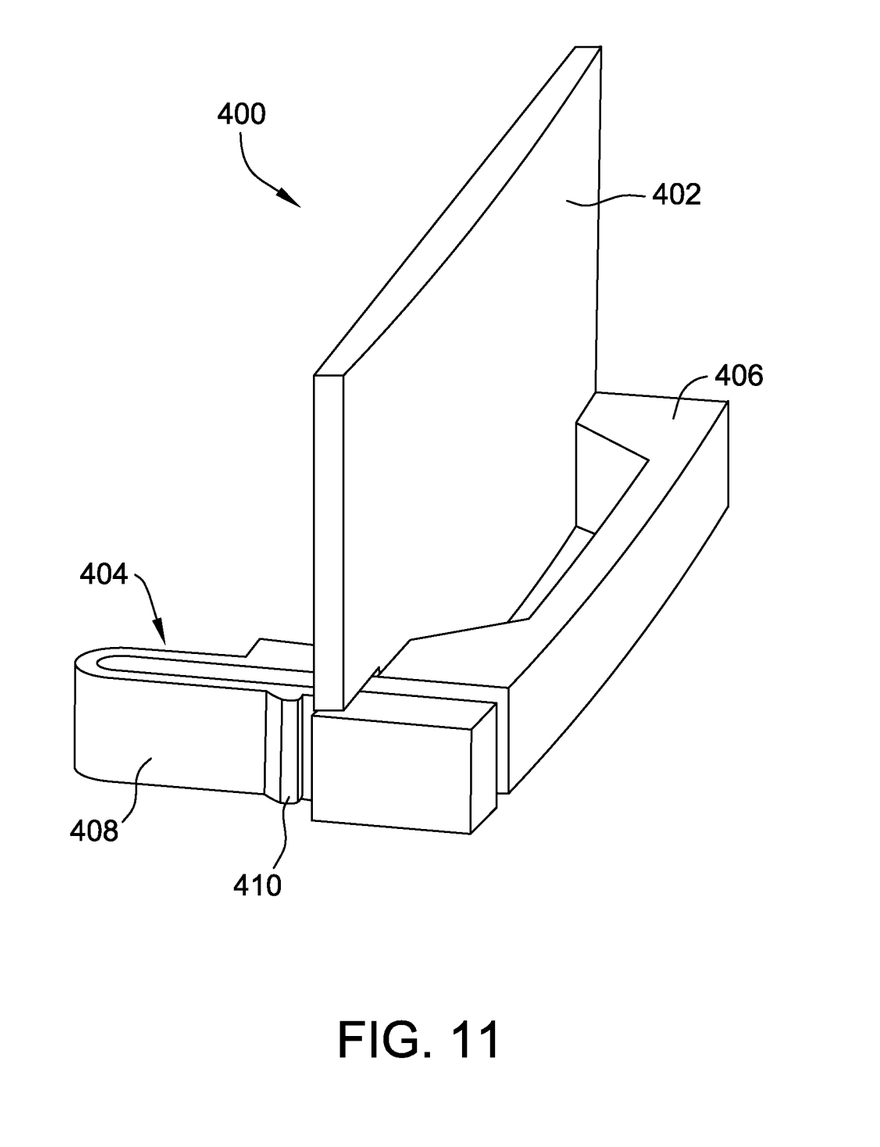
FIG. 11 is yet another alternative embodiment of the faceplate of the faceplate assembly shown in FIGS. 1 and 2.

FIG. 11 illustrates an alternative embodiment of a faceplate assembly 400 for use in shelf assembly 50 (shown in FIG. 1). Faceplate assembly 400 includes a faceplate 402, an integrated spring latch 404, and a handle 406. Faceplate 402 is shown as a solid faceplate, although faceplate 402 may include venting similar to plurality of vents 146 (shown in FIG. 8), louvered venting 202 (shown in FIG. 9), or hex grille 302 (shown in FIG. 10). Furthermore, faceplate 402 may have the same undulated shape as front face 143 of faceplate 140 with peaks 149 and 155 (shown in FIG. 8) and troughs 151 (shown in FIG. 8). Faceplate assembly 400 also includes user interface assembly 160 (shown in FIGS. 2 and 7), which has been removed for clarification purposes. Faceplate assembly 400 includes integrated spring latch 404 that functions substantially similarly to integrated spring latch 188 (shown in FIGS. 2, 3, and 5). Integrated spring latch 404 includes spring arm 408 and projection 410. In operation, a user grasps handle 406 and displaces spring arm 408 with the users thumb to disengage projection 410 from a corresponding projection land (not shown) disposed on faceplate 402 or shelf 60 (shown in FIG. 1). When integrated spring latch 404 is disengaged, the user is able to remove module 100 (shown in FIGS. 1 and 2) from shelf 60 using handle 406.

Exemplary embodiments of electronics module shelf assemblies are described herein. The shelf assembly includes at least one electronics module that includes a faceplate assembly. The faceplate assembly includes a faceplate, an ejection lever, and a user interface assembly. The faceplate and ejection lever are undulated and include a plurality of vents to facilitate cooling the internal components of the module. The ejection lever includes an integrated spring latch that cooperates with the faceplate to lock the module in place and retain the module within the shelf assembly. The user interface assembly includes a plurality of component status indicators that provide the status of each electric component coupled to the module. Furthermore, the user interface includes a membrane switch that allows a user to interact with the module and receive feedback from the module regarding the status of the module as a whole and the status of each electronic component coupled to the module. Additionally, the user interface assembly includes a flex circuit that couples the interface, having the status indicators and the switch, to a circuit board within the module. The flex circuit is configured to provide power to the user interface to illuminate a plurality of LEDs that are formed integrally with the user interface and to relay signals between the user interface and the circuit board to facilitate user interaction with the module.

As compared to at least some known electronic module assemblies, the integrated spring latch in the ejection lever eliminates the need for additional components, such as a spring, to ejection the module from the shelf assembly. Furthermore, because only the ejection lever transitions from an open position to a closed position, instead of the whole faceplate assembly, the faceplate protects the internal components of the module even during insertion and ejection. Additionally, the user interface assembly allows interaction between a user and the module not seen in known electronic module assemblies. Also, the need for complex lightpipes and manufacturing tolerances of openings in known faceplates into which to insert the lightpipes and LEDs are eliminated because the use of a flex circuit allows for a single wide tolerance slot in the faceplate and the LEDs are integral with the flex circuit and the user interface.

Exemplary embodiments of an electronics module shelf assembly and methods for assembling the same are described above in detail. The methods and assemblies are not limited to the specific embodiments described herein, but rather, components of assemblies and/or steps of the methods may be utilized independently and separately from other components and/or steps described herein. For example, the methods may also be used in combination with other electronic module assemblies, and are not limited to practice with only the power distribution modules and assemblies as described herein. Rather, the exemplary embodiment can be implemented and utilized in connection with many other electronic module applications.

Although specific features of various embodiments of the invention may be shown in some drawings and not in others, this is for convenience only. In accordance with the principles of the invention, any feature of a drawing may be referenced and/or claimed in combination with any feature of any other drawing. Further, although words such as "top" and "bottom" are used throughout the specification, there is no absolute orientation in the universe. For example, when the modules slotted into a chassis on its side, then top and bottom become the sides.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electronics chassis comprising:
an electronics module residing in a slot defined within the electronics chassis;
a multi-piece faceplate system coupled to said electronics module and comprising:
a faceplate; and
a faceplate assembly with:
an ejection lever pivotally coupled to said electronics module, said ejection lever including an ejection tool positioned proximate the slot;
an ejection latch releasably coupled to said faceplate;
a lever arm extending between said ejection tool and said ejection latch, said ejection latch comprises a spring arm movable with respect to said lever arm to facilitate retention of said electronics module within said electronics chassis when said faceplate assembly is in a closed position, and configured to facilitate ejection of said electronics module from said electronics chassis when said faceplate assembly is in an open position, wherein a gap is defined between a distal end of said lever arm and said spring arm, and;
a user interface assembly configured to facilitate interaction between said electronics module and a user.

2. The electronics chassis according to claim 1, wherein said spring arm having a projection configured to be latchably coupled to a projection land on said faceplate.

3. The electronics chassis according to claim 2, wherein said spring arm is biased to engage said projection with said projection land to facilitate retention of said electronics module within said one slot and to disengage said projection from said projection land to facilitate ejection of said electronics module from said one slot.

4. The electronics chassis according to claim 1, wherein said faceplate includes an undulated front face configured to channel an air flow therethrough to facilitate cooling said electronics module.

5. The electronics chassis according to claim 1, wherein said faceplate includes a plurality of vents comprising a plurality of front slats offset from a plurality of back slats such that said pluralities of front and back slats are configured to protect at least one internal component of said electronics module.

6. The electronics chassis according to claim 1, wherein said user interface assembly includes a plurality of component status indicators and a module status indicator.

7. The electronics chassis according to claim 1, wherein said user interface assembly includes an interactive device configured to receive input from the user.

8. The electronics chassis according to claim 1, wherein said user interface assembly includes a flex circuit configured to relay user input and response signals between said user interface assembly and a circuit board housed within said electronics module.

9. A multi-piece faceplate system for use in an electronics module residing in a slot defined in an electronics chassis, said faceplate system comprising:
  a faceplate; and
  a faceplate assembly with: an ejection lever pivotally coupled to said electronics module, said ejection lever including an ejection tool operatively positioned proximate the slot, an ejection latch releasably coupled to said faceplate assembly, a lever arm extending between said ejection tool and said ejection latch, said ejection latch comprises a spring arm movable with respect to said lever arm to facilitate retention of said electronics module within said chassis when said faceplate assembly is in a closed position, and configured to facilitate ejection of said electronics module from said chassis when said faceplate assembly is in an open position, wherein a gap is defined between a distal end of said lever arm and said spring arm, and a user interface assembly configured to facilitate interaction between the electronics module and a user.

10. The faceplate assembly according to claim 9, wherein said spring arm having a projection configured to be latchably coupled to a projection land on said faceplate.

11. The faceplate assembly according to claim 10, wherein said spring arm is biased to engage said projection with said projection land to facilitate retention of said electronics module within said shelf assembly and to disengage said projection from said projection land to facilitate ejection of said electronics module from said shelf assembly.

12. The faceplate assembly according to claim 9, wherein said faceplate includes an undulated front face that includes a plurality of vents configured to channel an air flow therethrough to facilitate cooling said electronics module.

13. The faceplate assembly according to claim 9, wherein said a user interface assembly comprises a plurality of component status indicators and a module status indicator, wherein said plurality of component status indicators and said module status indicator are light emitting diodes (LEDs) integrated within said user interface assembly.

14. The faceplate assembly according to claim 9, wherein said a user interface assembly comprises an interactive device configured to receive input from the user to facilitate interaction between said electronics module and the user.

15. The faceplate assembly according to claim 9, wherein said a user interface assembly comprises a flex circuit configured to relay user input and response signals between said user interface assembly and a circuit board housed within said electronics module.

16. A method of assembling an electronics chassis, said method comprising:
  providing an electronics module configured to reside in a slot defined in an electronics chassis;
  providing a multi-piece faceplate system including a faceplate and a faceplate assembly, wherein the faceplate assembly includes an ejection lever including an ejection tool, an ejection latch, and a lever arm extending between said ejection tool and said ejection latch;
  pivotally coupling the ejection lever to the electronics module;
  operatively coupling the ejection tool to the electronics chassis;
  releasably coupling the ejection latch to the faceplate, wherein the ejection latch includes a spring arm movable with respect to the lever arm to facilitate retention of the electronics module within the electronics chassis when the faceplate assembly is in a closed position, and to facilitate ejection of the electronics module from the electronics chassis when the faceplate assembly is in an open position, wherein a gap is defined between a distal end of said lever arm and said spring arm; and
  coupling a user interface assembly to the faceplate assembly, wherein the user interface assembly is configured to facilitate interaction between the electronics module and a user.

17. The method according to claim 16, wherein the spring arm includes a projection, and wherein releasably coupling at least a portion of the faceplate to the ejection latch comprises:
  latchably coupling the projection to a projection land on the faceplate; and
  biasing the spring arm to engage the projection with the projection land to retain the electronics module within the slot and to disengage the projection from the projection land to eject the electronics module from the slot.

18. The method according to claim 16 further comprising channeling a flow of air through a front face of the faceplate to facilitate cooling the electronics module, wherein the front face includes a plurality of vents and has an undulated shape.

19. The method according to claim 16, wherein the user interface assembly includes an interactive device, a plurality of component status indicators, a module status indicator, and a flex circuit, the method further comprising:
  inputting, by a user, a command on the user interface assembly using the interactive device;
  relaying, through the flex circuit, a signal generated by the interactive device between the user interface assembly and a circuit board housed within the electronics module; and
  indicating, to the user, the status of the electronics module on the module status indicator and the status of at least one electrical component coupled to the electronics module on a respective component status indicator of a plurality of component status indicators.

* * * * *